United States Patent
Lin

(10) Patent No.: US 7,122,990 B2
(45) Date of Patent: Oct. 17, 2006

(54) DIGITAL SERVO MOTOR CONTROLLER IC DESIGN FOR PREVENTING THE POWER FEEDBACK EFFECT DURING MANUAL ADJUSTING THE SERVO MOTOR

(75) Inventor: Wei Cheng Lin, Taipei (TW)

(73) Assignee: Princeton Technology Corporation, Hsin Tien (TW)

( * ) Notice: Subject to any disclaimer, the term of this patent is extended or adjusted under 35 U.S.C. 154(b) by 568 days.

(21) Appl. No.: 10/661,618

(22) Filed: Sep. 15, 2003

(65) Prior Publication Data

US 2005/0060671 A1    Mar. 17, 2005

(51) Int. Cl.
   *G05B 1/06*    (2006.01)
(52) U.S. Cl. ...................... 318/638; 318/560
(58) Field of Classification Search ............... 318/638, 318/560
   See application file for complete search history.

(56) References Cited

U.S. PATENT DOCUMENTS

| 4,471,280 A | * | 9/1984 | Stack ......................... 318/586 |
| 4,847,603 A | * | 7/1989 | Blanchard ...................... 345/7 |
| 5,245,262 A | * | 9/1993 | Moody et al. ............... 318/560 |
| 5,341,249 A | * | 8/1994 | Abbott et al. .................. 360/46 |
| 5,780,989 A | * | 7/1998 | Matsumoto .................. 318/632 |
| 6,122,232 A | * | 9/2000 | Schell et al. ............. 369/44.11 |
| 6,208,497 B1 | * | 3/2001 | Seale et al. .................. 361/160 |
| 6,417,638 B1 | * | 7/2002 | Guy et al. ................... 318/560 |
| 6,567,230 B1 | * | 5/2003 | Kagami et al. ................ 360/75 |
| 6,741,529 B1 | * | 5/2004 | Getreuer .................. 369/30.17 |
| 2001/0043450 A1 | * | 11/2001 | Seale et al. .................. 361/160 |
| 2003/0080772 A1 | * | 5/2003 | Giacomini et al. ......... 324/771 |

* cited by examiner

*Primary Examiner*—Rita Leykin
(74) *Attorney, Agent, or Firm*—Birch, Stewart, Kolasch & Birch, LLP

(57) ABSTRACT

The present invention provides an improvement design for a digital servo motor controller IC to prevent the power feedback effect during manual adjusting the servo motor. A circuit is added at each output of the digital servo motor controller IC. The added circuit comprises a divider circuit and three NMOS inverter circuits connected sequentially. The outputs of the second and the third MOS inverter circuits are used as the inputs for the servo motor, so as to avoid the power feedback effect during manual adjusting of the servo motor.

3 Claims, 3 Drawing Sheets

DIGITAL SERVO MOTOR CONTROLLER IC DESIGN FOR PREVENTING THE POWER FEEDBACK EFFECT DURING MANUAL ADJUSTING THE SERVO MOTOR

FIELD OF THE INVENTION

The present invention relates to an improvement design of an IC, and more particularly to an improvement design of a digital servo motor controller IC for preventing the power feedback effect during manual adjusting the servo motor.

BACKGROUND OF THE INVENTION

The system block diagram of a conventional remote-controlled game motor or plane is shown in FIG. 1, in which the remote-controlled signal transmitter 2 accepts manual instructions from the joystick 1, and transmits signals to the receiver 3 of a game motor or plane. After being processed the signals will be inputted to a digital servo motor controller 4 for controlling the motor 5 of the game motor or plane, so as to rotate the wheels of the motor or control the propplers of the plane.

The circuits between the digital servo motor controller 4 and the motor 5 are shown in FIG. 2. The digital servo motor controller 4 has two outputs OUT1 and OUT2, after being passed through the INV1 and INV2 respectively to generate OUT1B and OUT2B, four signals OUT1, OUT2, OUT1B, OUT2B will be inputted to power MOS transistors PMOS1, NMOS2, PMOS3, NMOS4 respectively. Four diodes D1, D2, D3, D4 are parallel connected with the four power MOS transistors PMOS1, NMOS2, PMOS3, NMOS4 respectively as shown. Since the breakdown voltage of the four diodes is lower than that of the four power MOS transistors, the four power MOS transistors will be prevented from damaging by any static voltage. PMOS1 and NMOS2 are serially connected at point A. PMOS3 and NMOS4 are serially connected at point B. The motor 5 is connected between point A and B.

When OUT1 and OUT2 are both "0", the motor 5 is stopped. When OUT1 is "0", OUT2 is "1", the motor 5 will be turned left. When OUT1 is "1", OUT2 is "0", the motor 5 will be turned right. OUT1 and OUT2 are both "1" is prohibited. Table 1 shows the results.

TABLE 1

| OUT1 | OUT2 | motor 5 |
|---|---|---|
| 0 | 0 | stop |
| 0 | 1 | turn left |
| 1 | 0 | turn right |
| 1 | 1 | prohibited |

Table 1 shows the operation of the system. When the system is not operated, the digital servo motor controller 4 and the motor 5 are not powered on, and the motor 5 can be rotated manually to adjust the initial position. As the motor 5 is rotated manually, the motor 5 will become a generator to generate some power to be fed back to digital servo motor controller 4 and cause both OUT1 and OUT2 to be "1", so as to short the points A and B of the motor 5. Due to this short situation, a huge amount of reverse current will be generated and fed to the motor 5, and generate a great reverse torque to resist the manual rotating of the motor, therefore the initial position of the motor 5 is not very easy to be adjusted.

OBJECT OF THE INVENTION

It is therefore an object of the present invention to provide an improvement design for digital servo motor controller IC for preventing the power feedback effect during manual adjusting the servo motor. A circuit is added respectively at the original outputs of the digital servo motor controller, which comprises a divider and three NMOS inverters connected sequentially. The outputs of the second and the third NMOS are used as the inputs of the servo motor, so as to achieve preventing the power feedback effect during manual adjusting the servo motor. When the system is not powered on, the motor can be rotated manually to adjust the initial position very easily.

DETAILED DESCRIPTION OF THE INVENTION

Figure 3:
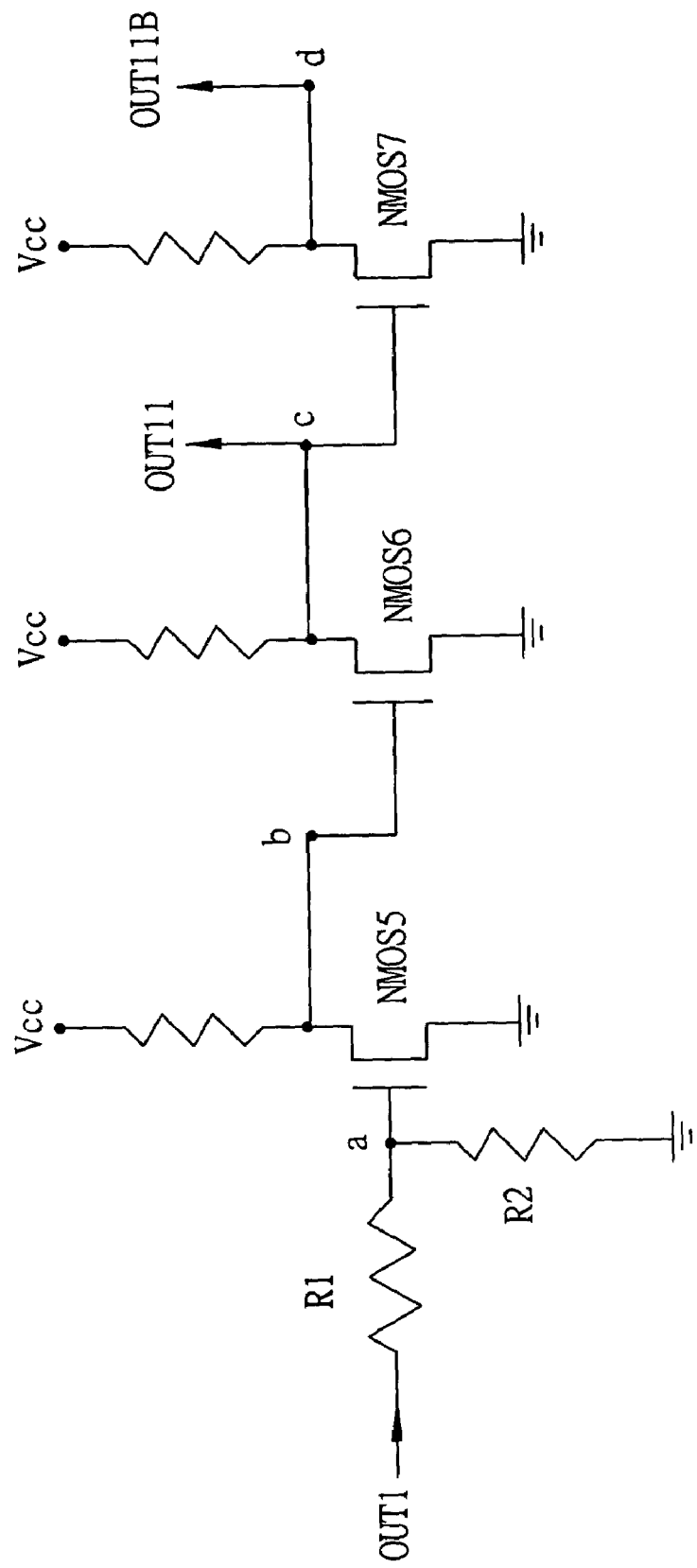
FIG. 3 shows schematically the circuit added in a digital servo motor controller IC according to the present invention.

Referring to FIG. 3, which shows schematically the circuit added in a digital servo motor controller IC according to the present invention. The circuit is added after each of the two outputs OUT1 and OUT2 of the original digital servo motor controller 4 in IC.

The output OUT1 will be used as an example for explanation as shown in FIG. 3. Resistors R1 and R2 form a divider, OUT1 is sent to the input of R1, the connecting point "a" between R1 and R2 is connected with the gate of NMOS5. The drain of NMOS5 is connected at point "b" with the gate of NMOS6. The drain of NMOS6 is connected at point "c" with the gate of NMOS7. The point "c" is the output OUT11. The point "d" is the drain of NMOS7, and is the output OUT11B. OUT11 and OUT11B are used to substitute the OUT1 and OUT1B in FIG. 2 for driving the motor 5 according to the present invention.

Figure 1:
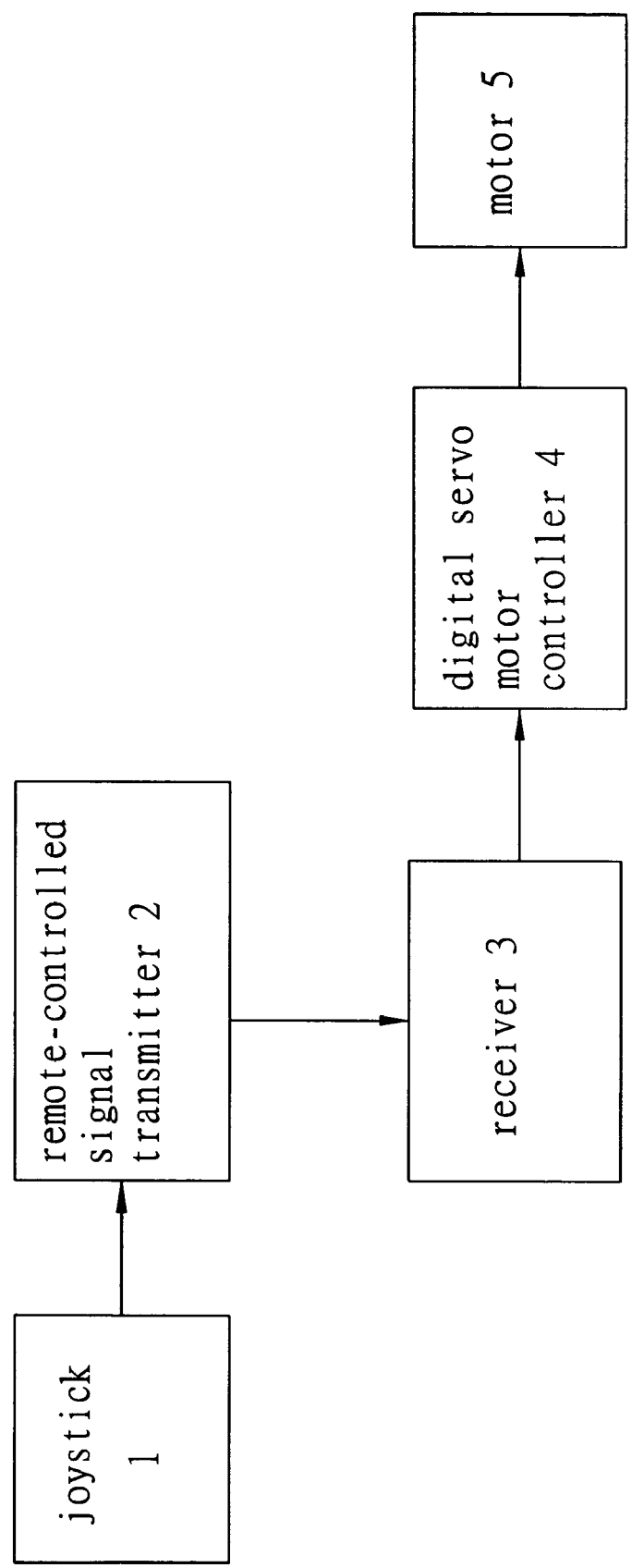
FIG. 1 shows schematically the system block diagram of a conventional remote-controlled game motor or plane.
Figure 2:
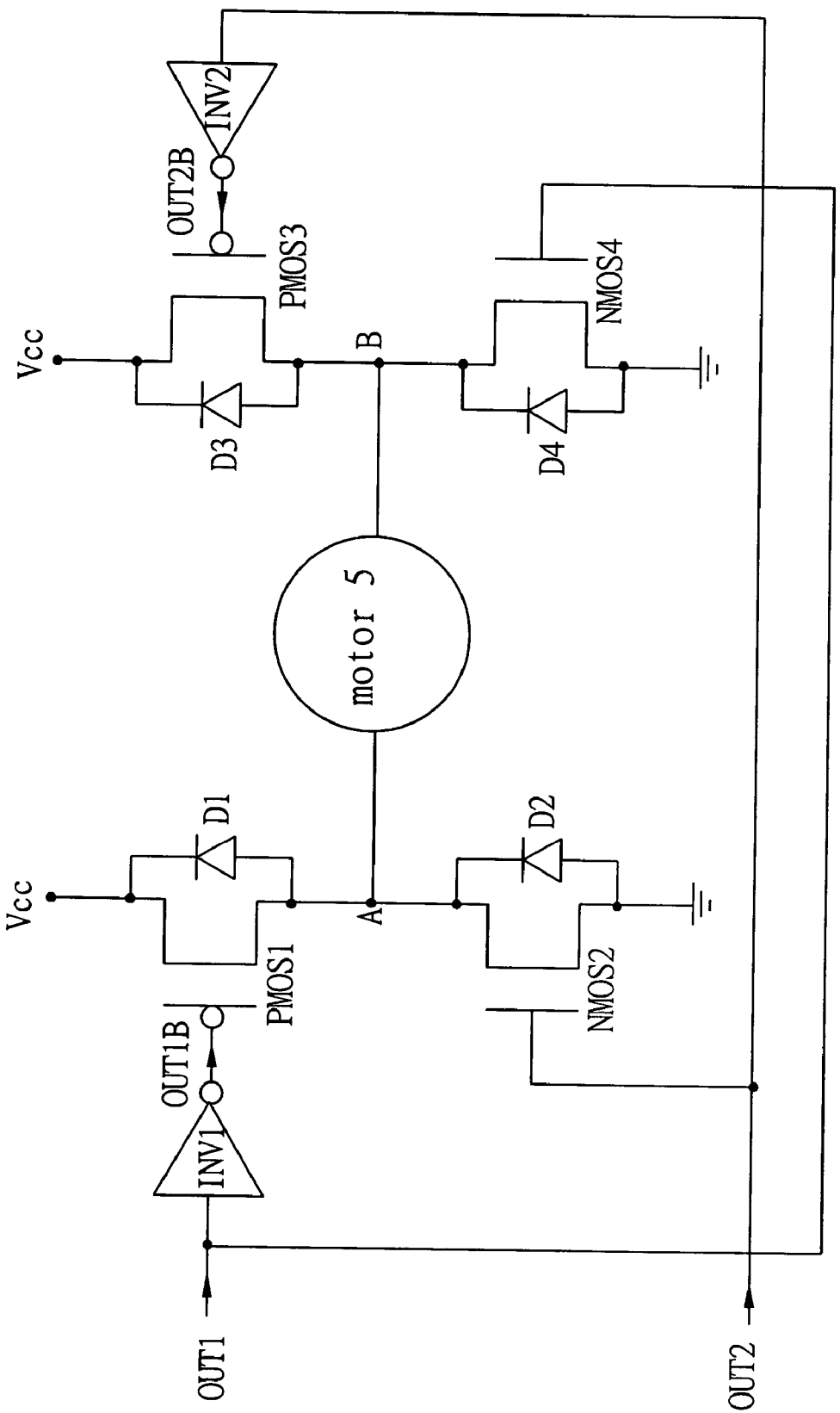
FIG. 2 shows schematically the conventional circuit diagram between a digital servo motor controller IC and a motor.

Similarly, as to output OUT2, the present invention will use the similar circuit as in FIG. 3 to generate OUT22 and OUT22B to substitute the OUT2 and OUT2B in FIG. 2 for driving the motor 5.

The resistances of the resistors R1 and R2 are properly designed such that when the voltage of OUT1 is higher than or equal to 3 volts, NMOS5 will be conducting; when the voltage of OUT1 is lower than 3 volts, NMOS5 will be opened.

When the system is not powered on, if we try to rotate the motor 5 manually so as to generate some little power (this is the most possible case) to be fed back to the system, and make OUT1 lower than 3 volts, than NMOS5 will be opened, the voltage at point "b" will be high, NMOS6 is therefore conducting. When NMOS6 is conducting, the voltage of point "c" will be low (i.e. OUT11 is "0"), NMOS7 is therefore opened, the voltage at point "d" will be high. (i.e. OUT11B is "1").

Similarly, when the system is not powered on, if we try to rotate the motor 5 manually so as to generate some little power (this is the most possible case) to be fed back to the system, and make OUT2 lower than 3 volts, than NMOS5 will be opened, the voltage at point "b" will be high, NMOS6 is therefore conducting. When NMOS6 is conducting, the voltage of point "c" will be low (i.e. OUT22 is "0"), NMOS7 is therefore opened, the voltage at point "d" will be high. (i.e. OUT22B is "1").

Therefore, when the system is not powered on, if we try to rotate the motor 5 manually so as to generate some little power (this is the most possible case) to be fed back to the system, OUT11 will be "0", OUT11B will be "1", OUT22 will be "0", OUT22B will be "1", so the four power MOS transistors PMOS1, NMOS2, PMOS3, NMOS4 will all be opened. Consequently, there is no power feedback effect as to the motor 5, and we can rotate the motor 5 very easily to achieve the purpose of the present invention.

The circuit in FIG. 3 can also prevent the motor from trembling (power exhausting) during normal power-on (not feed back power) as OUT1, OUT2 to be "0, 1", "1, 0" or "1,1."

When the system is not powered on, if we try to rotate the motor 5 manually so as to generate some big power (this is not the normal possible case) to be fed back to the system, the IC of digital servo motor controller 4 will work as being powered on, and OUT1, OUT2 will be controlled by the signal from the joystick 1 of the remote-controlled signal transmitter 2. However, since the joystick 1 does not send out any signal, OUT1 and OUT2 will be both "0", so OUT11 and OUT22 will be both "0". Referring to table 1, we know that the motor 5 will not rotate, i.e. no power (voltage) is passed through the motor 5. Therefore it is very easy to rotate the motor 5 to achieve the purpose of the present invention.

The circuit in FIG. 3 of the present invention is built in the IC of digital servo motor controller 4. PMOS can be used instead to achieve the purpose of the present invention.

The spirit and scope of the present invention depend only upon the following Claims, and are not limited by the above embodiments.

What is claimed is:

1. An improvement design for a digital servo motor controller IC, comprising a circuit added at each original output of the digital servo motor controller IC, said circuit including a divider and three MOS inverter connected sequentially; said original output of the digital servo motor controller IC is inputted into said divider, and an output of said divider is inputted into the first MOS inverter; an output of the second MOS inverter and an output of the third MOS inverter are inputted into a servo motor for preventing the power feedback effect during manual adjusting the servo motor.

2. An improvement design for a digital servo motor controller IC according to claim 1, wherein said divider comprising two resistors, the resistances thereof is designed such that when each original output of the digital servo motor controller IC is higher than or equal to a predetermined voltage, the first MOS inverter will be conducting, and when each original output of the digital servo motor controller IC is lower than said predetermined voltage, said first MOS inverter will be opened.

3. An improvement design for a digital servo motor controller IC according to claim 1, wherein said predetermined voltage is 3 volts.

* * * * *